US009425148B2

(12) United States Patent
Kim et al.

(10) Patent No.: US 9,425,148 B2
(45) Date of Patent: Aug. 23, 2016

(54) SEMICONDUCTOR DEVICES HAVING CONTACTS WITH INTERVENING SPACERS AND METHOD FOR FABRICATING THE SAME

(71) Applicant: Samsung Electronics Co., Ltd., Suwon-Si, Gyeonggi-Do (KR)

(72) Inventors: Ho-Jun Kim, Gyeonggi-do (KR); Hae-Wang Lee, Gyeonggi-do (KR); Chul-Hong Park, Gyeonggi-do (KR); Dong-Kyun Sohn, Gyeonggi-do (KR); Jong-Shik Yoon, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 163 days.

(21) Appl. No.: 13/718,138

(22) Filed: Dec. 18, 2012

(65) Prior Publication Data
US 2013/0248990 A1 Sep. 26, 2013

(30) Foreign Application Priority Data

Mar. 21, 2012 (KR) ........................ 10-2012-0028575

(51) Int. Cl.
| H01L 23/538 | (2006.01) |
| H01L 29/78 | (2006.01) |
| H01L 21/8234 | (2006.01) |
| H01L 21/768 | (2006.01) |
| H01L 23/528 | (2006.01) |
| H01L 23/532 | (2006.01) |

(52) U.S. Cl.
CPC ...... *H01L 23/5384* (2013.01); *H01L 21/76816* (2013.01); *H01L 21/76831* (2013.01); *H01L 21/76834* (2013.01); *H01L 21/76885* (2013.01); *H01L 21/76897* (2013.01); *H01L 21/823437* (2013.01); *H01L 21/823475* (2013.01); *H01L 29/7827* (2013.01); *H01L 23/5283* (2013.01); *H01L 23/53238* (2013.01); *H01L 23/53266* (2013.01); *H01L 2924/0002* (2013.01)

(58) Field of Classification Search
None
See application file for complete search history.

(56) References Cited

U.S. PATENT DOCUMENTS 5,990,493 A * 11/1999 Gardner ............ H01L 21/76801
257/382
6,818,546 B2 * 11/2004 Saito ................. H01L 21/28518
257/E21.576

(Continued)

FOREIGN PATENT DOCUMENTS

| KR | 2008-0101613 A | 11/2008 |
| KR | 2010-0050911 A | 5/2010 |

(Continued)

*Primary Examiner* — Steven Loke
*Assistant Examiner* — Juanita Rhodes
(74) *Attorney, Agent, or Firm* — Harness, Dickey & Pierce

(57) ABSTRACT

Semiconductor devices, and a method for fabricating the same, include an interlayer dielectric film pattern over a substrate, a first wiring within the interlayer dielectric film pattern and having a first length in a first direction, a second wiring within the interlayer dielectric film pattern and separated from the first wiring, and a spacer contacting the first wiring and the second wiring. The spacer electrically separates the first wiring and the second wiring from each other. The second wiring has a second length different from the first length in the first direction.

20 Claims, 13 Drawing Sheets

(56) References Cited

U.S. PATENT DOCUMENTS

| | | | | |
|---|---|---|---|---|
| 2001/0045651 | A1* | 11/2001 | Saito | H01L 21/28518 257/750 |
| 2005/0151264 | A1* | 7/2005 | Saito | H01L 21/76838 257/762 |
| 2007/0007617 | A1* | 1/2007 | Nakamura | H01L 27/11 257/503 |
| 2008/0157212 | A1* | 7/2008 | Lavoie | H01L 21/823842 257/369 |
| 2008/0284006 | A1* | 11/2008 | Hong | H01L 21/76816 257/734 |
| 2008/0299733 | A1* | 12/2008 | Press | H01L 21/31116 438/299 |
| 2009/0146313 | A1* | 6/2009 | Terazono | H01L 24/05 257/774 |
| 2009/0267233 | A1* | 10/2009 | Lee | H01L 21/2007 257/758 |
| 2010/0052069 | A1* | 3/2010 | Wirbeleit | H01L 21/76895 257/369 |
| 2010/0059801 | A1 | 3/2010 | Kamei et al. | |
| 2011/0183512 | A1* | 7/2011 | Cho | H01L 21/76831 438/627 |
| 2011/0227136 | A1* | 9/2011 | Park | H01L 21/28518 257/288 |
| 2012/0104514 | A1* | 5/2012 | Park | H01L 21/28518 257/411 |
| 2013/0026570 | A1* | 1/2013 | Fan | H01L 21/84 257/347 |

FOREIGN PATENT DOCUMENTS

| | | |
|---|---|---|
| KR | 2010-0111889 A | 10/2010 |
| KR | 2011-0086338 A | 7/2011 |

* cited by examiner

SEMICONDUCTOR DEVICES HAVING CONTACTS WITH INTERVENING SPACERS AND METHOD FOR FABRICATING THE SAME

CROSS-REFERENCE TO RELATED APPLICATION

This application claims priority from Korean Patent Application No. 10-2012-0028575 filed on Mar. 21, 2012 in the Korean Intellectual Property Office, and all the benefits accruing therefrom under 35 U.S.C. 119, the contents of which are herein incorporated by reference in their entirety.

BACKGROUND

1. Field

At least one example embodiment relates to semiconductor devices, and at least one other example embodiment relates to a method for fabricating the same.

2. Description of the Related Art

According to the development of electronic technology, semiconductor devices have recently been rapidly down-scaled. In the down-scaled semiconductor device, a distance between semiconductor patterns is rapidly decreasing and a distance between wirings connecting the semiconductor patterns is also reduced. Many studies for achieving stable semiconductor device functionality are carried out even with the reduced wiring distance.

In a semiconductor device having a pitch of 30 nm or less, for example, a distance between each of a gate pattern and source and/or drain patterns constituting a transistor, may be reduced. Accordingly, a distance between contacts connecting the gate and source and/or drain to metal wirings is also reduced. In separating the contacts connecting various elements of a transistor, it is necessary to spatially separate the contacts from each other while securing a margin in consideration of errors that may be generated in lithography. If the margin is taken into consideration in designing the layout of a semiconductor device, the number of semiconductor devices to be included in a unit area may be reduced, thereby lowering the yield. In addition, if multiple metal wirings are disposed in the same level, the layout of the metal wirings may become complicated, thereby causing burdens in metal processing.

SUMMARY

At least one example embodiment relates to semiconductor devices, and at least one other example embodiment relates to a method for fabricating the same.

Another example embodiment relates to a semiconductor device, which can improve scalability using a spacer formed between contacts connecting adjacent patterns.

Another example embodiment relates to a method for fabricating a semiconductor device, which can improve scalability using a spacer formed between contacts connecting adjacent patterns.

According to a first example embodiment, there is provided a semiconductor device including an interlayer dielectric film pattern over a substrate, a first wiring within the interlayer dielectric film pattern and having a first length in a first direction, a second wiring within the interlayer dielectric film pattern and separated from the first wiring. The second wiring has a second length different from the first length in the first direction. The semiconductor device further includes a spacer contacting the first wiring and the second wiring. The spacer electrically separates the first wiring and the second wiring from each other.

The spacer may include a first region and a second region. The first region may be between the first wiring and the second wiring and may have a width smaller than a width of the second region.

The first wiring may include a first side surface extending in the first direction and a second side surface extending in a second direction. The second wiring may be adjacent to the first side surface.

The first wiring may be rectangular. The first side surface may be longer than the second side surface.

The semiconductor device may further include a first active region and a second active region spaced apart from each other on the substrate; a first pattern and a second pattern on the first active region and the second active region, respectively; a third pattern traversing the first active region and the second active region. The first pattern and the second pattern may be on a same side surface of the third pattern. The first pattern and the second pattern may be connected to the first wiring. The third pattern may be connected to the second wiring.

The first pattern and the second pattern may each include a metal plug stacked over a silicide film. The third pattern may be a gate pattern.

The third pattern may extend in the first direction. The first wiring may extend within the first active region and the second active region to be parallel with the third pattern. The second wiring may not overlap the first active region and the second active region.

The semiconductor device may further include a barrier metal film between the spacer and the first wiring.

The spacer may include at least one of SiN, SiON, SiCN, SiOC and combinations thereof.

According to a second example embodiment, there is provided a semiconductor device including a first pattern and a second pattern over a substrate adjacent to each other, an interlayer dielectric film pattern including a first opening and a second opening over the first pattern and the second pattern, respectively, a first wiring and a second wiring filling the first opening and the second opening, respectively, and a spacer between a side upper portion of the first wiring and a side upper portion of the second wiring. The spacer separates the first wiring and the second wiring from each other.

An upper surface of the first wiring, an upper surface of the second wiring and an upper surface of the spacer may be formed at a same level.

An upper portion of the spacer on one side surface of the first wiring and the second wiring may have a first width. An upper portion of the spacer on another side surface of the first wiring than the one side surface of the first wiring may have a second width. The first width may be smaller than the second width.

A height of the second wiring may be longer than a height of the first wiring.

The semiconductor device may further include a buried insulation film having a first trench and a second trench between the substrate and the interlayer dielectric film pattern. The first trench and the second trench may correspond to the first wiring and the second wiring, respectively. The second pattern may include a gate insulation film and a gate electrode in the second trench. The gate electrode may include portions conformally covering side surfaces and a bottom surface of the second trench, and the first pattern may include a metal plug on a silicide film in the first trench.

An uppermost surface of the substrate positioned at a lower portion of the first trench may be elevated relative to the uppermost surface of the substrate positioned at a lower portion of the second trench.

According to a third example embodiment, there is provided a semiconductor device, including a first contact pattern and a second contact pattern each traversing different active regions of a substrate; a third contact pattern extending along a side of the first and second contact patterns; an interlayer dielectric film pattern over the first, second and third contact patterns; a multi-wiring structure extending through the interlayer dielectric film pattern, the multi-wiring structure including a first wiring and a second wiring separated from each other and a spacer adjoined to the first and second wirings. The first wiring is electrically connected to the first and second contact patterns, and the second wiring is electrically connected to the third contact pattern.

The spacer may cover upper sidewalls of the first wiring. A portion of the spacer adjoined to the first and second wirings may have a width that decreases toward an upper surface of the first wiring.

The second wiring may be spaced apart from each of the different active regions.

The first wiring may have an upper surface extending along a single plane.

The semiconductor device may further include a barrier metal film conformally covering sidewalls and a bottom surface of the first wiring. The spacer and the barrier metal film may spatially separate the first wiring from the second wiring. The spacer may be directly adjoined to the second wiring, and may be indirectly adjoined to the first wiring via the barrier metal film.

BRIEF DESCRIPTION OF THE DRAWINGS

The above and other features and advantages of the example embodiment will become more apparent by describing in detail preferred embodiments thereof with reference to the attached drawings in which.

DETAILED DESCRIPTION OF THE EXAMPLE EMBODIMENTS

Figure 1:
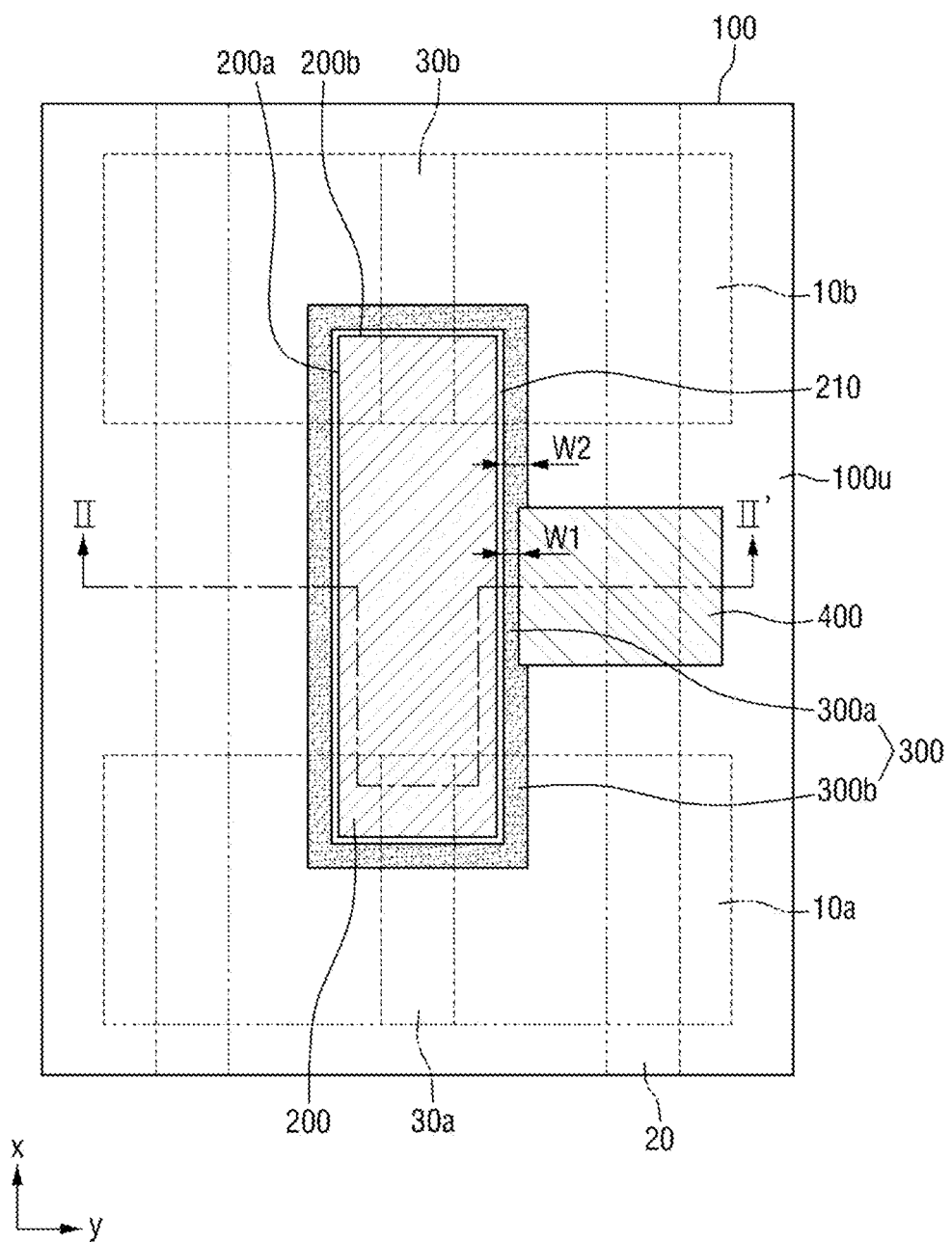
FIG. 1 is a plan view of a semiconductor device according to an example embodiment.

Various example embodiments will now be described more fully with reference to the accompanying drawings in which some example embodiments are shown. However, specific structural and functional details disclosed herein are merely representative for purposes of describing example embodiments. Thus, the invention may be embodied in many alternate forms and should not be construed as limited to only example embodiments set forth herein. Therefore, it should be understood that there is no intent to limit example embodiments to the particular forms disclosed, but on the contrary, example embodiments are to cover all modifications, equivalents, and alternatives falling within the scope of the invention.

In the drawings, the thicknesses of layers and regions may be exaggerated for clarity, and like numbers refer to like elements throughout the description of the figures.

Although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that, if an element is referred to as being "connected" or "coupled" to another element, it can be directly connected, or coupled, to the other element or intervening elements may be present. In contrast, if an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," if used herein, specify the presence of stated features, integers, steps, operations, elements and/or components, but do not preclude the presence or addition of one or more other features, integers, steps, operations, elements, components and/or groups thereof.

Spatially relative terms (e.g., "beneath," "below," "lower," "above," "upper" and the like) may be used herein for ease of description to describe one element or a relationship between a feature and another element or feature as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation that is above, as well as, below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In order to more specifically describe example embodiments, various aspects will be described in detail with reference to the attached drawings.

At least one example embodiment relates to semiconductor devices, and at least one other example embodiment relates to a method for fabricating the same.

Hereinafter, a semiconductor device according to an example embodiment will be described with reference to FIGS. 1 and 2.

FIG. 1 is a plan view of a semiconductor device according to a first example embodiment. FIG. 2 is a cross-sectional view taken along the line II-IF of FIG. 1.

Referring to FIG. 1, a semiconductor device includes an interlayer dielectric film pattern 100, a first wiring 200, a second wiring 400 and a spacer 300. The semiconductor device may further include a barrier metal film 210 between the first wiring 200 and the spacer 300. The interlayer dielectric film pattern 100 is formed on a substrate (not shown). The interlayer dielectric film pattern 100 covers parts, excluding the first wiring 200, the second wiring 400 and the spacer 300. The first wiring 200 is formed within the interlayer dielectric film pattern 100. The first wiring 200 extends in a first direction (x). That is to say, the first wiring 200 may be shaped of, for example, a rectangle elongated in one direction. The second wiring 400 is formed within the interlayer dielectric film pattern 100. The second wiring 400 may also be shaped of a rectangle elongated in one direction, like the first wiring 200, but not limited thereto. The second wiring 400 is separated from the first wiring 200 to then be electrically disconnected. Assuming that a first direction (x) length of the first wiring 200 is a first length and a first direction (x) length of the second wiring 400 is a second length, the first length and the second length are different from each other. The spacer 300 is formed in the vicinity of the first wiring 200 and spatially and electrically separates the first wiring 200 and the second wiring 400 from each other. The spacer 300 may be formed to make contact with both of the first wiring 200 and the second wiring 400. The barrier metal film 210 may surround the first wiring 200 and may be surrounded by the spacer 300. However, the barrier metal film 210 does not make contact with the second wiring 400.

In detail, the interlayer dielectric film pattern 100 may be made of an insulating material, for example, silicon oxide or a low dielectric constant material, or may be doped with an impurity. The interlayer dielectric film pattern 100 may be formed by, for example, spin-on, sputtering, chemical vapor deposition (CVD) or high density CVD.

The first wiring 200 is formed in a first opening (200t of FIG. 2) formed in the interlayer dielectric film pattern 100 in the first direction (x). A portion of the first wiring 200 may overlap first and second patterns 30a and 30b positioned under the first wiring 200. The first wiring 200 extending in the first direction (x) is electrically connected to both of the first and second patterns 30a and 30b. The first wiring 200 may be shaped of, for example, a rectangle elongated in one direction, but not limited thereto. That is to say, the first wiring 200 has a shape similar to a rectangle with corners of the rectangle rounded. The first wiring 200 may include, but not limited to, at least one conductive material, for example, tungsten (W), copper (Cu) and alloys thereof. The first wiring 200 may be formed by, for example, chemical vapor deposition (CVD), atomic layer deposition (ALD) or electroplating, but not limited thereto.

The barrier metal film 210 may suppress, or prevent, the conductive material included in the first wiring 200 from being diffused into the interlayer dielectric film pattern 100 or the underlying first and second patterns 30a and 30b. The barrier metal film 210 may be made of a conductive material and may include, for example, titanium nitride (TiN), tantalum nitride (TaN) or a combination thereof. The barrier metal film 210 may be formed by, for example, atomic layer deposition (ALD), sputtering or chemical vapor deposition (CVD), electroplating, but not limited thereto.

The second wiring 400 may be formed in a second opening (400t of FIG. 2) formed in the interlayer dielectric film pattern 100. A portion of the second wiring 400 may overlap, for example, a third pattern 20 positioned thereunder. In the semiconductor device according to the example embodiment, the second wiring 400 is electrically connected to one underlying third pattern 20, but aspects of the example embodiment are not limited thereto. Rather, the second wiring 400 may extend in a second direction (y) to then be electrically connected to a plurality of patterns each having the same shape as the third pattern at the same time. The second wiring 400 may include at least one of tungsten (W), copper (Cu) and a combination thereof, like the first wiring 200. In addition, in the same manner as the first wiring 200 surrounded by the barrier metal film 210, the second wiring 400 may also be surrounded by a conductive film serving as a diffusion preventing film.

The spacer 300 spatially separates the first wiring 200 or the barrier metal film 210 from the second wiring 400, thereby preventing current from flowing. In the illustrated example embodiment, the spacer 300 surrounds the first wiring 200 or the barrier metal film 210, but aspects of the example embodiment are not limited thereto. That is to say, the spacer 300 is formed only at a portion of the first wiring 200 corresponding to the first side surface 200a adjacent to the second wiring 400. However, in a case where the spacer 300 is formed only at a portion of the first wiring 200 corresponding to the first side surface 200a, several process steps may further be provided, compared to a case where the spacer 300 is entirely formed around the first wiring 200.

The spacer 300 may be made of an insulating material. In addition, the spacer 300 may be made of, for example, an etching resistant material with respect to the interlayer dielectric film pattern 100. The spacer 300 may include, for example, at least one of silicon nitride (SiN), silicon oxynitride (SiON), silicon carbon nitride (SiCN), silicon carbide (SiC), organosilicate glass (SiOC) and combinations thereof. The material used as the spacer 300 may be selected in consideration of, for example, selectivity to the interlayer dielectric film pattern 100, a space between the first wiring 200 and the second wiring 400, or the like.

Referring to FIG. 1, the spacer 300 may include a first region 300a positioned between the first wiring 200 and the second wiring 400, and a second region 300b excluding the first region 300a. The first region 300a may have a width w1 and the second region 300b have a width w2. As shown in FIG. 1, the width w1 of the first region 300a may be smaller than the width w2 of the second region 300b. As the second wiring 400 becomes closer to the first wiring 200, the width w1 of the first region 300a may be reduced. In the illustrated example embodiment of the semiconductor device, the side surfaces of the first wiring 200 and the second wiring 400 adjacent to each other are substantially parallel with each other. Therefore, the width w1 of the first region 300a has the same width, irrespective of location. In addition, if the barrier metal film 210 is positioned around the first wiring 200, the width w1 of the first region 300a corresponds to a distance between the barrier metal film 210 and the second wiring 400. Here, "the same width" may be used to mean that widths at two locations compared are completely equal to each other and to encompass a negligibly small width difference due to a processing margin, etc. However, if the side surface of the second wiring 400 adjacent to the first wiring 200 is curved or formed at a predetermined (or, alternatively, set) angle with respect to the first side surface 200a of the first wiring 200, the width w1 of the first region 300a may vary according to the location. Here, the width w1 of the first region 300a may mean the shortest distance between the first wiring 200 and the second wiring 400.

A distance between the first wiring 200 and the second wiring 400 spaced apart from each other by the spacer 300 may be determined by materials forming the first and/or second wirings 200 and 400. For example, a diffusion length on silicon may vary according to the chemical elements. In order to prevent the distance between the first wiring 200 and the second wiring 400 from being affected by the materials forming the first and second wirings 200 and 400, the distance between the first wiring 200 and the second wiring 400 should be greater than the diffusion length. Accordingly, if the materials forming the first and/or second wirings 200 and 400 are changed, the distance between the first wiring 200 and the second wiring 400 spaced apart from each other by the spacer 300, that is, the minimum of the width w1 of the first region 300a, may be changed. For example, if the material forming the first and second wirings 200 and 400 is tungsten (W), the width w1 of the first region 300a may be greater than or equal to 7 nm. In addition, if at least one of the first wiring 200 and second wiring 400 is made of, for example, copper (Cu), the width w1 of the first region 300a may be greater than or equal to 12 nm.

Referring to FIG. 1, the first wiring 200 may be shaped of, for example, a rectangle having a first side surface 200a extending in a first direction (x) and a second side surface 200b extending in a second direction (y). The second wiring 400 may be formed to be adjacent to the first side surface 200a of the first wiring 200. The first side surface 200a may be a long side of the first wiring 200, and the second side surface 200b may be a short side of the first wiring 200. The second wiring 400 may be formed to be adjacent to the long side of the first wiring 200, and a space between the second wiring 400 and the long side of the first wiring 200 may correspond to the width w1 of the first region 300a. On a plan view, a conductive wiring formed by the first wiring 200 and the second wiring 400 may be T-shaped. Because the first wiring 200 and the second wiring 400 are separated from each other by the spacer 300 made of an insulating material, the first wiring 200 and the second wiring 400 are electrically insulated from each other to then operate independently.

Referring to FIG. 1, the first pattern 30a and the second pattern 30b are formed under the first wiring 200. The third pattern 20 is formed under the second wiring 400. The first to third patterns 30a, 30b and 20 may be surrounded by the interlayer dielectric film pattern 100. The interlayer dielectric film pattern 100 is formed on the substrate (1 of FIG. 2) on which the semiconductor device according to the example embodiment is formed. For example, the first pattern and second patterns 30a and 30b may be formed by sequentially stacking conductive patterns formed on the source and/or drain of a transistor including, for example, a silicide film and a metal plug. Alternatively, the first pattern and second patterns 30a and 30b may be a source and/or a drain of a transistor, or metal wirings, respectively. The third pattern 20 may be, for example, a gate pattern of a transistor, a contact electrode or a metal wiring. In addition, the first and second patterns 30a and 30b may be multi source and/or drain or conductive patterns formed on the multi source and/or drain. The third pattern 20 may also be a multi gate device having a plurality of channels. However, the first and second patterns 30a and 30b formed as conductive patterns formed on the source and/or drain and the third pattern 20 formed as a gate pattern are provided only for illustrating the semiconductor device according to the example embodiment, but aspects of the example embodiment are not limited thereto.

A first active region 10a and a second active region 10b spaced apart from each other are defined on the substrate positioned under the interlayer dielectric film pattern 100. The first and second active regions 10a and 10b may be shaped of rectangles extending in a second direction (y), but aspects of the example embodiment are not limited thereto. The first to third patterns 30a, 30b and 20 are formed on the first active region 10a and the second active region 10b, respectively. The third pattern 20 may be formed across the first and second active regions 10a and 10b. For example, the third pattern 20 may be formed not only on the first and second active regions 10a and 10b but also on regions isolating the first and second active regions 10a and 10b from each other.

The first and second patterns 30a and 30b may be formed on the first and second active regions 10a and 10b, respectively. The first and second patterns 30a and 30b may be formed to be parallel with the same side surface of the third pattern 20, that is, in the first direction (x). The first and second patterns 30a and 30b formed in parallel in the first direction (x) are connected to the first wiring 200 extending in the first direction (x) and are electrically connected at the same time. The third pattern 20 is connected to the second wiring 400. In this case, an electrical signal is applied to the second wiring 400 to turn on the third pattern 20, so that the first pattern 30a, the first wiring 200 and the second pattern 30b are electrically connected to serve as a single conductive wire.

Referring to FIG. 1, the third pattern 20 extends in the first direction (x). The first wiring 200 extending in the first direction (x) may be formed throughout the first and second active regions 10a and 10b. On the plan view, a predetermined (or, alternatively, desired) portion of the first wiring 200 is formed to overlap the first and second active regions 10a and 10b. The first wiring 200 may be formed to be parallel with the third pattern 20. The second wiring 400 may not be formed on the first and second active regions 10a and 10b but on regions isolating the first and second active regions 10a and 10b. That is to say, the second wiring 400 may be formed on regions not overlapping the first and second active regions 10a and 10b. Accordingly, it is possible to prevent electrical short circuits between the first and second patterns 30a and 30b with a reduced distance therebetween and the second wiring 400 formed on the third pattern 20 by forming the second wiring 400 in the above-described manner.

Figure 2:
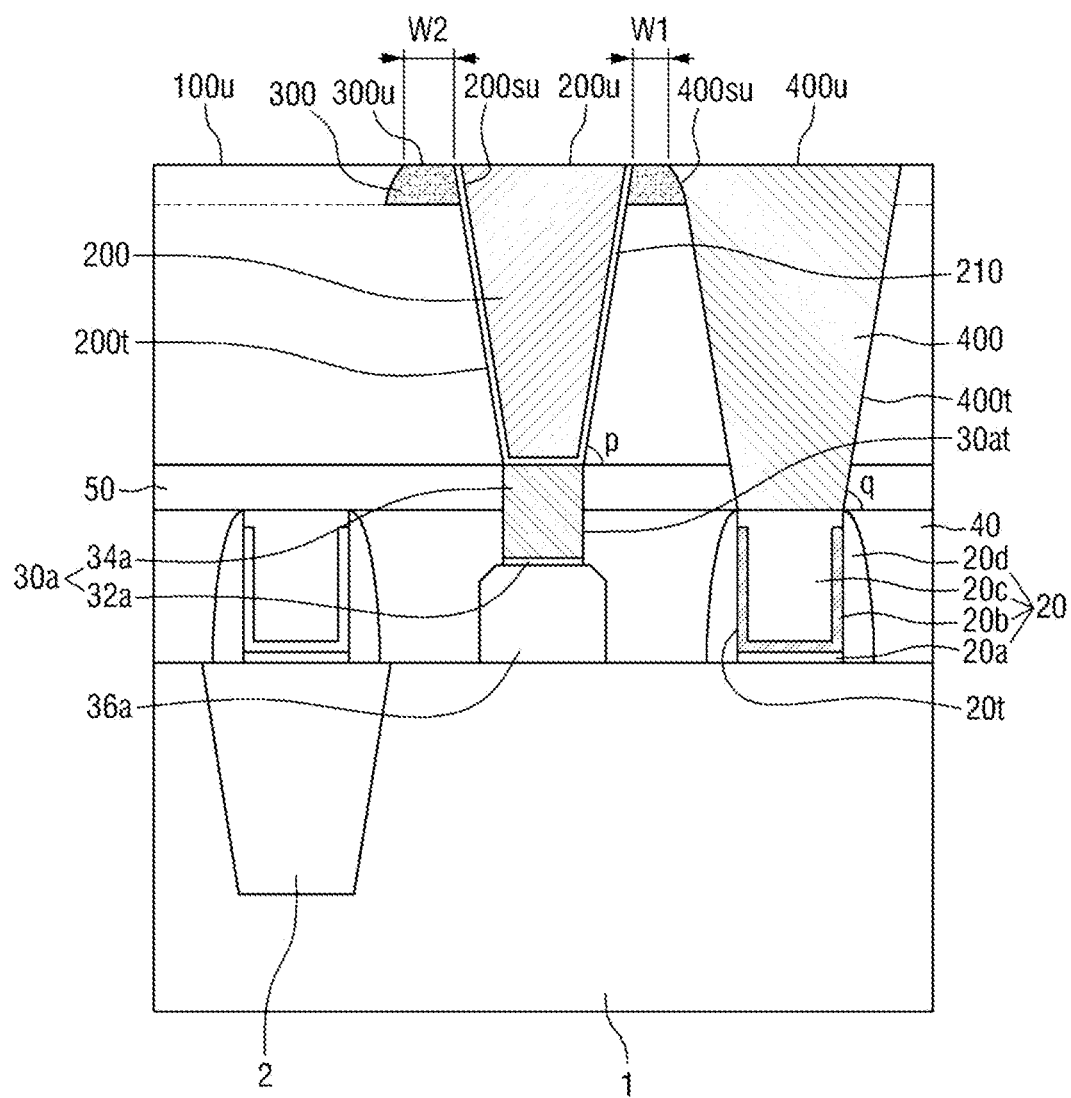
FIG. 2 is a cross-sectional view taken along the line II-II' of FIG. 1.

Referring to FIG. 2, the semiconductor device according to the example embodiment includes a first pattern 30*a*, a third pattern 20, an interlayer dielectric film pattern 100, a first wiring 200, a second wiring 400 and a spacer 300. The semiconductor device may further include a barrier metal film 210 positioned between the first wiring 200 and the interlayer dielectric film pattern 100. The semiconductor device may further include buried insulation films 40 and 50 between the interlayer dielectric film pattern 100 and the substrate 1. The first pattern 30*a* and the third pattern 20 are formed on the substrate 1 to be adjacent to each other. The interlayer dielectric film pattern 100 is formed on the first pattern 30*a* and the third pattern 20, and may include a first opening 200*t* and a second opening 400*t*. The first opening 200*t* and the second opening 400*t* are formed on the first pattern 30*a* and the third pattern 20, respectively. Specifically, the first wiring 200 is formed in the first opening 200*t*, and the second wiring 400 is formed in the second opening 400*t*. In other words, the first wiring 200 and the second wiring 400 are formed by burying the first opening 200*t* and the second opening 400*t*. If the barrier metal film 210 is formed between the interlayer dielectric film pattern 100 and the first wiring 200, it may be conformally formed on sidewalls and bottom surface of the first opening 200*t*, and the first wiring 200 is formed on the barrier metal film 210. While the second wiring 400 and the first pattern 30*a* shown in FIG. 2 are positioned adjacent to each other, the second wiring 400 and the first pattern 30*a* shown in FIG. 1 are not spatially adjacent to each other but are spaced apart from each other. The spacer 300 is positioned between the first wiring 200 and the second wiring 400. The first wiring 200 and the second wiring 400 are spaced apart from each other by the spacer 300. In detail, the spacer 300 is positioned between a side upper portion 200*su* of the first wiring 200, and a side upper portion 400*su* of the second wiring 400.

In detail, the substrate 1 may be a silicon substrate, a SOI (silicon-on-insulator) substrate, a gallium arsenic substrate, a silicon germanium substrate, a ceramic substrate, a quartz substrate, or a glass substrate for display. In addition, a P-type substrate or an N-type substrate may be used as the substrate 1. Although not shown, the substrate 1 may include a P-type well or an N-type well doped with a p-type or n-type impurity, respectively. The isolation region 2 may be, for example, regions excluding the first and second active regions 10*a* and 10*b* shown in FIG. 1.

The third pattern 20 may be, for example, a gate pattern. In the semiconductor device according to the example embodiment, the third pattern 20 is formed in the second trench 20*t* of the first buried insulation film 40 formed on the substrate 1. The second trench 20*t* is formed at a location corresponding to the second wiring 400. In detail, the first buried insulation film 40 covers a dummy pattern (not shown) formed on the substrate 1 and polishing is performed to expose the dummy pattern. Thereafter, the second trench 20*t* is formed in the first buried insulation film 40 by removing the dummy pattern. Next, the third pattern 20 is formed in the second trench 20*t*. The aforementioned process may be provided only for illustrating the example embodiment. Alternatively, the buried insulation films 40 and 50 may also be formed after the third pattern 20 is formed on the substrate 1.

The third pattern 20 may include a gate insulation film 20*a*, a first gate electrode 20*b* and a second gate electrode 20*c*. After the second trench 20*t* is formed, the gate insulation film 20*a* may be formed on the substrate 1. Alternatively, before the first buried insulation film 40 is formed, the gate insulation film 20*a* may be formed on the substrate 1. The gate insulation film 20*a* may be made of a high dielectric constant material having a higher dielectric constant than silicon oxide, but aspects of the example embodiments are not limited thereto. The gate insulation film 20*a* may also be made of silicon oxide. The high dielectric constant material may include, but not limited to, at least one of hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. The gate insulation film 20*a* may be formed by a deposition method, for example, chemical vapor deposition (CVD), physical vapor deposition (PVD), or atomic layer deposition (ALD).

The first gate electrode 20*b* may be conformally formed on sidewalls and bottom surface of the second trench 20*t*, specifically on the gate insulation film 20*a*. On the cross-sectional view, the first gate electrode 20*b* may be shaped of a cup. The first gate electrode 20*b* may include, but not limited to, at least one of titanium nitride (TiN), tantalum nitride (TaN) and a combination thereof. The second gate electrode 20*c* is formed on the first gate electrode 20*b*. The second gate electrode 20*c* may include at least one of titanium-aluminum (TiAl), titanium nitride (TiN), titanium (Ti), aluminum, and combinations thereof.

The first pattern 30*a* may be, for example, a contact electrode formed on the source and/or drain. The first pattern 30*a* is formed in a first trench 30 at formed in each of the first and second buried insulation films 40 and 50. The first trench 30 at is formed at a location corresponding to the first wiring 200. The first pattern 30*a* may include a silicide film 32*a* and a metal plug 34*a* sequentially formed on the substrate 1. The silicide film 32*a* may be, for example, self aligned silicide. The silicide film 32*a* may include, but not limited to, nickel (Ni), cobalt (Co), platinum (Pt) or titanium (Ti). The metal plug 34*a* may connect the silicide film 32*a* to the first wiring 200. The metal plug 34*a* may include, but is not limited to, tungsten (W).

The first pattern 30*a* may be elevated relative to the substrate 1. A topmost surface of the substrate 1 positioned at a lower portion of the first trench 30 at, that is, a topmost surface of an elevated portion 36*a*, is elevated relative to the topmost surface of the substrate 1 positioned at a lower portion of the second trench 20*t*, a boundary surface between the gate insulation film 20*a* and the substrate 1. The elevated portion 36*a* may be formed on the substrate 1, by, for example, an epitaxial growth method.

Referring to FIG. 2, the interlayer dielectric film pattern 100 may be divided into two parts along the dotted line. The interlayer dielectric film pattern 100 positioned below the dotted line may be a portion formed before the spacer 300 is formed, and the interlayer dielectric film pattern 100 positioned above the dotted line may be a portion formed after the spacer 300 is formed, but aspects of the example embodiment are not limited thereto. However, the interlayer dielectric film patterns divided by the dotted line may be made of the same material, but aspects of the example embodiment are not limited thereto.

The first opening 200*t* formed in the interlayer dielectric film pattern 100 may expose a top portion of the underlying metal plug 34*a*. The second opening 400*t* included in the interlayer dielectric film pattern 100 may expose a top portion of the underlying second gate electrode 20*c*. The second opening 400*t* may be formed while penetrating (or, alternatively, extending through) the interlayer dielectric film pattern 100 and the second buried insulation film 50. A bottom extending line of the first opening 200t and a side surface of the first opening 200t may form a first angle (p), and a bottom extending line of the second opening 400t and a side surface of the second opening 400t form a second angle (q). The first angle (p) and the second angle (q) may vary according to the etch rate or etchant material of the interlayer dielectric film pattern 100. At least one of the first angle (p) and the second angle (q) may be in a range of 82° to 90°, but aspects of the example embodiment are not limited thereto.

The materials forming the first wiring 200 and the second wiring 400 are the same as those shown in FIG. 1 and a detailed description will not be given. A width of the upper surface 200u of the first wiring 200, that is, a critical dimension, may be between 30 nm and 60 nm. A width of the upper surface 400u of the second wiring 400, that is, a distance between the first pattern 30a and the third pattern 20 may vary according to the second angle (q).

Referring to FIG. 2, the spacer 300 is positioned between the side upper portion 200su of the first wiring 200 and the side upper portion 400su of the second wiring 400. In other words, the spacer 300 is formed along the periphery of the side upper portion 200su of the first wiring 200. The side upper portion 400su of the second wiring 400 may have a planar, or a curved, surface contacting the spacer 300. In addition, a slope of the side upper portion 400su of the second wiring 400 contacting the spacer 300 may be different from a slope of the other side surface of the second opening 400t, but aspects of the example embodiment are not limited thereto. The spacer 300 may have a thickness of, for example, 3 nm to 20 nm, but aspects of the example embodiment are not limited thereto. The thickness of the spacer 300 may vary according to the kind of material used as the spacer 300, or the material used as the first wiring 200 or the second wiring 400.

A width of an upper portion of the spacer 300 formed between one side of the first wiring 200 and the second wiring 400 is w1, and a width of an upper portion of the spacer 300 formed on the other side opposite to the one side of the first wiring 200 is w2. Here, the widths w1 and w2 are equal to the widths of the first region 300a and the second region 300b of the spacer 300 shown in FIG. 1. Accordingly, w1 is smaller than w2. In addition, the upper surface 200u of the first wiring 200, the upper surface 400u of the second wiring 400 and the upper surface 300u of the spacer 300 are formed at the same level. In other words, distances between the substrate 1 and the upper surface 200u of the first wiring 200, the upper surface 400u of the second wiring 400 and the upper surface 300u of the spacer 300 may be equal to each other. Here, "the same level" may be used to mean that heights at two locations compared are completely equal to each other and to encompass a negligibly small height difference due to a processing margin, etc.

Referring to FIG. 2, a height of the second wiring 400 may be greater than a height of the first wiring 200. In other words, a bottom surface of the first wiring 200 is positioned at a boundary surface between the interlayer dielectric film pattern 100 and the second buried insulation film 50. A bottom surface of the second wiring 400 is positioned at a boundary surface between the first buried insulation film 40 and the second buried insulation film 50. Therefore, the height of the second wiring 400 may be equal to a thickness of the second buried insulation film 50 that is higher than the height of the first wiring 200.

A semiconductor device according to another example embodiment will be described with reference to FIG. 3. Because the present example embodiment is substantially the same as the previous example embodiment, except for a direction in which a first wiring and a second wiring are disposed adjacent to each other, the same functional components are denoted by the same reference numerals and repeated descriptions will be briefly given or omitted.

Figure 3:
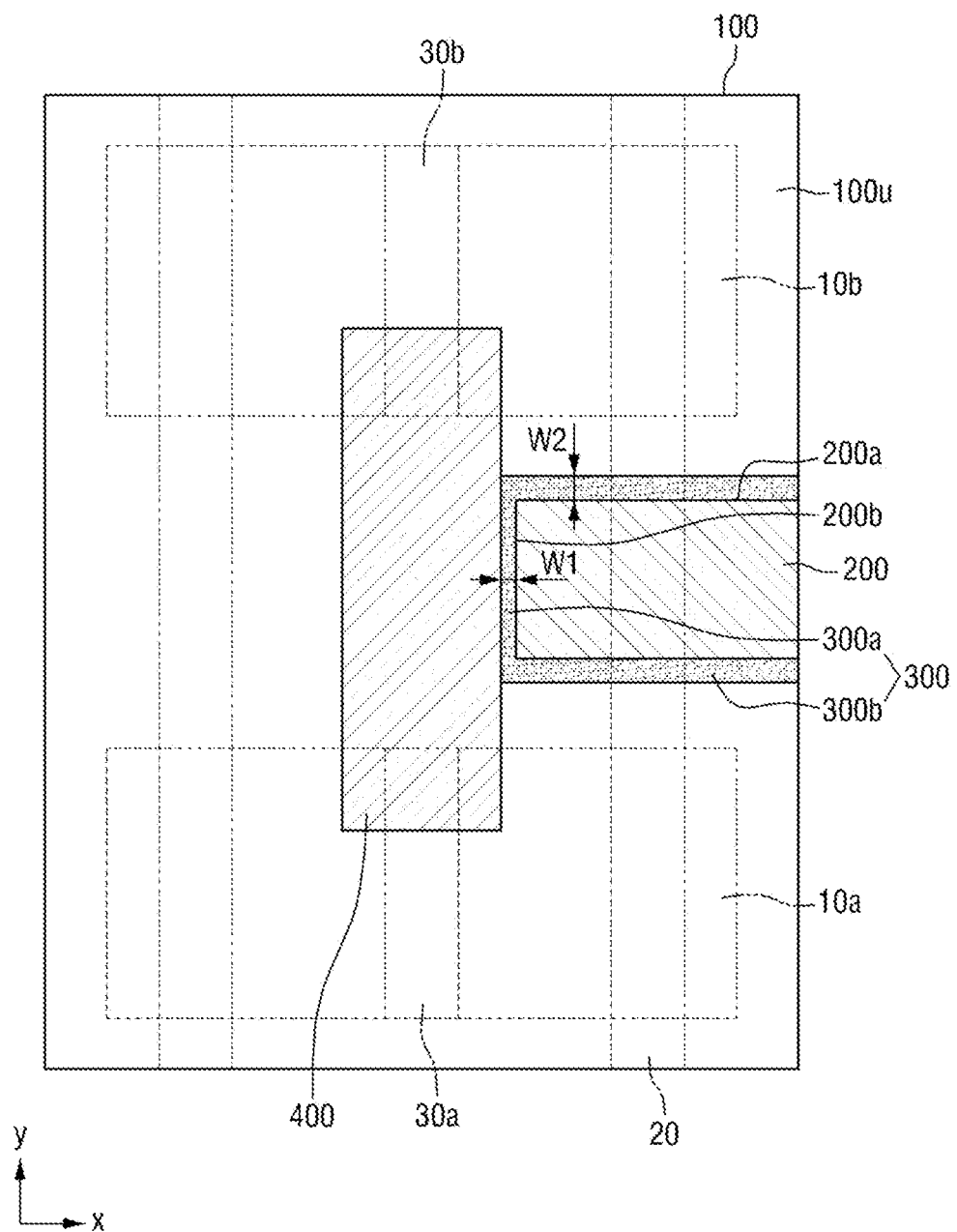
FIG. 3 is a plan view of a semiconductor device according to another example embodiment.

FIG. 3 is a plan view of a semiconductor device according to another example embodiment.

Referring to FIG. 3, the first wiring 200 includes a first side surface 200a extending in the first direction (x) and a second side surface 200b extending in a second direction (y). The first wiring 200 may be shaped in the form of a rectangle having the first side surface 200a and the second side surface 200b positioned adjacent to each other. On the plan view, the second wiring 400 may be formed adjacent to the second side surface 200b of the first wiring 200. That is to say, the second wiring 400 is separated from a short side of the first wiring 200 and positioned adjacent thereto. A distance between the second wiring 400 and the short side of the first wiring 200 is a width w1 of the first region 300a. On the plan view, a conductive wiring formed by the first wiring 200 and the second wiring 400 may be T-shaped.

Referring to FIG. 3, the first wiring 200 is connected to a third pattern 20, and the second wiring 400 is connected to both of a first pattern 30a and a second pattern 30b. The first wiring 200 may be formed so as not to overlap with a first active region 10a and a second active region 10b. For example, the first wiring 200 may be orthogonal to the third pattern 20, but aspects of the example embodiment are not limited thereto.

A method for fabricating a semiconductor device according to another example embodiment will be described with reference to FIGS. 4 to 12. The present example embodiment illustrates a method for fabricating the semiconductor device shown in FIGS. 1 and 2, and repeated descriptions will be briefly given or omitted.

FIGS. 4 to 12 are cross-sectional views illustrating process steps of a method for fabricating a semiconductor device according to yet another example embodiment.

Figure 4:
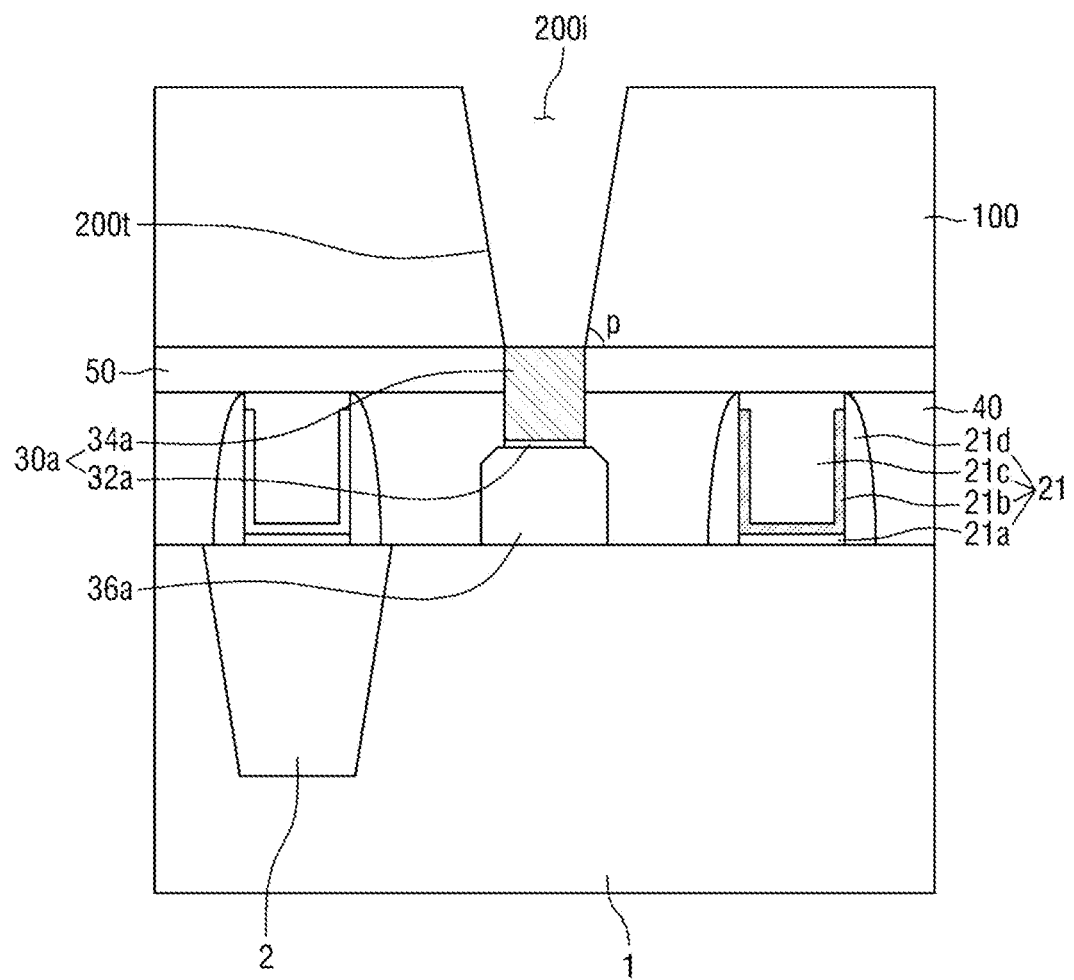
FIGS. 4 to 12 are cross-sectional views illustrating process steps of a method for fabricating a semiconductor device according to yet another example embodiment.

Referring to FIG. 4, a first pattern 30a and a second pattern 21 adjacent to each other are formed on the substrate 1. The first pattern 30a may be, for example, a contact electrode formed on source and/or drain regions. The second pattern 21 may be, for example, a gate pattern. In the following description, it is assumed that the second pattern 21 is a gate pattern. An isolation region 2 for isolating semiconductor devices is formed on the substrate 1. A dummy gate pattern (not shown) is formed on the substrate 1 having the isolation region 2. A dummy gate insulation film included in the dummy gate pattern may serve as a gate insulation film in the gate pattern 21 to be formed in a subsequent process. The dummy gate pattern is formed at a location corresponding to the second wiring (400 of FIG. 11) to be formed in a subsequent process. In addition, the source and/or drain regions are formed at opposite sides of the dummy gate pattern. The source and/or drain regions may be formed at the same level as the substrate 1 and may be an elevated semiconductor pattern 36a, as shown in FIG. 4. In the method for fabricating the semiconductor device according to the present example embodiment, the source and/or drain regions will be described with regard to the semiconductor pattern 36a elevated on the substrate 1, but aspects of the present example embodiment are not limited thereto.

The elevated semiconductor pattern 36a is formed at a location corresponding to the first wiring (200 of FIG. 5) to be formed in a subsequent process.

A first buried insulation film 40 is formed to cover the elevated semiconductor pattern 36a and the dummy gate pattern 21. The first buried insulation film 40 may expose an upper surface of the dummy gate pattern 21 while covering an upper surface of the elevated semiconductor pattern 36a. However, an upper surface of the elevated semiconductor pattern 36a may also be exposed by the first buried insulation film 40. A second trench having the substrate 1 exposed is formed in the first buried insulation film 40 by removing the exposed dummy gate pattern 21. A gate insulation film 21a and gate electrodes 21b and 21c are sequentially formed in the second trench, thereby forming the gate pattern 21. If a dummy gate insulation film is used as the gate insulation film 21a, the second trench exposes the gate insulation film 21a, and the gate electrodes 21b and 21c are formed on the exposed gate insulation film 21a. The gate electrodes may be formed in multiple layers, and at least one of the multiple layers, that is, a first gate electrode 21b, may be conformally covered along both side surfaces and bottom surface of the second trench.

A second buried insulation film 50 covering the first buried insulation film 40 and the gate pattern 21 is formed. The second buried insulation film 50 includes a first trench formed on the elevated semiconductor pattern 36a. The second trench may expose an upper surface of the elevated semiconductor pattern 36a. A silicide process is performed to form a silicide film 32a on the elevated semiconductor pattern 36a and a metal plug 34a on the silicide film 32a. The silicide film 32a and the metal plug 34a are sequentially formed in the first trench, thereby forming the first pattern 30a.

Referring to FIG. 4, the interlayer dielectric film pattern 100 is formed on the first pattern 30a and the gate pattern 21. The interlayer dielectric film pattern 100 may include a first opening 200t formed on the first pattern 30a. The first opening 200t may expose an upper surface of the first pattern 30a. If an etch stop layer (not shown) is further formed between the second buried insulation film 50 and the interlayer dielectric film pattern 100, a portion of the etch stop layer may be exposed by side surfaces of the first opening 200t.

Referring to FIG. 1, the first opening 200t may be shaped of a hexahedral box extending in one direction. An interior portion 200i of the first opening 200t is a space filled with a conductive material to be electrically connected to the first pattern 30a.

A side surface of the first opening 200t forms a first angle (p) with respect to the upper surface of the second buried insulation film 50. In other words, a bottom extending line of the first opening 200t and the side surface of the first opening 200t may form the first angle (p). The first angle (p) and may be in a range of 82° to 90°.

Figure 5:
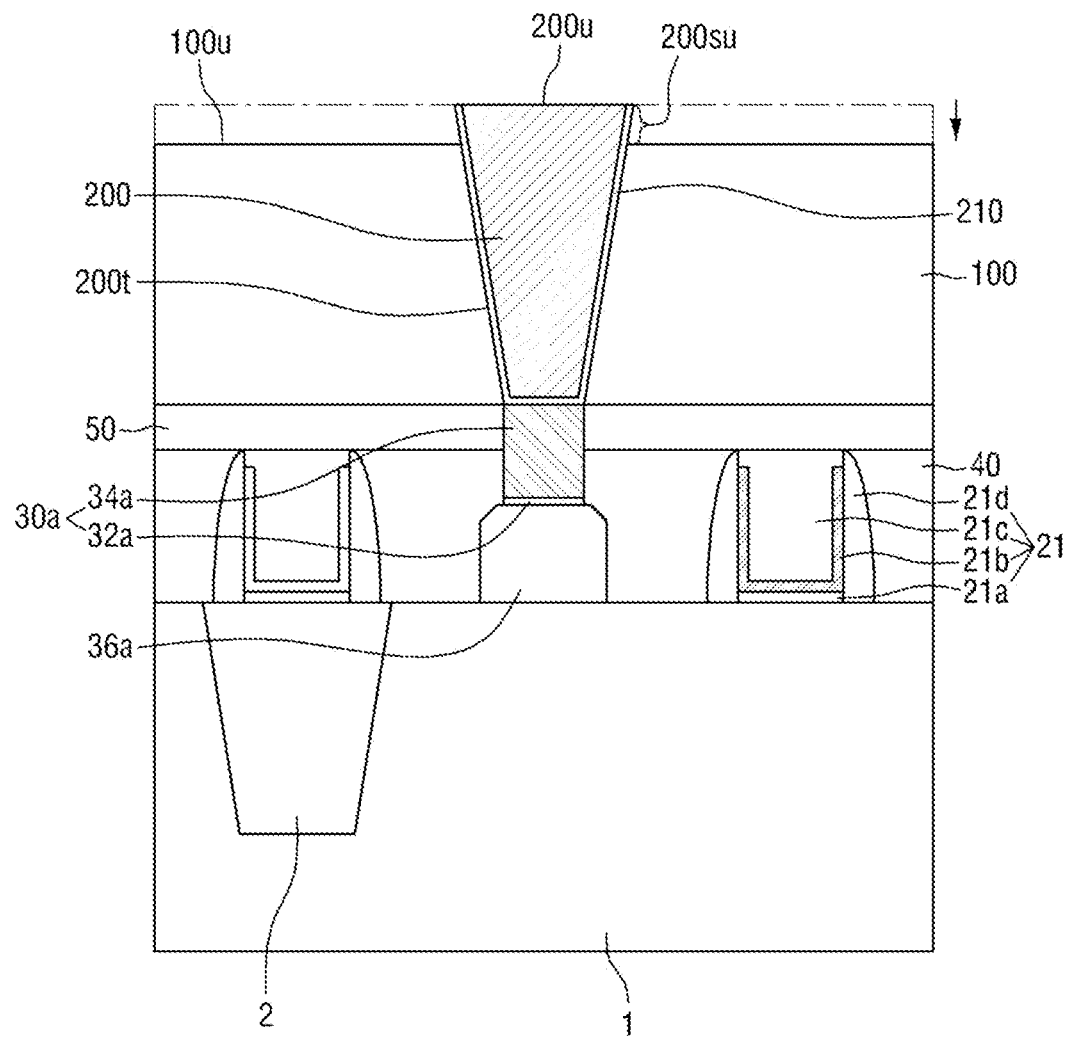

Referring to FIG. 5, a first wiring 200 is formed in the first opening 200t. A portion of the first wiring 200 protrudes from the upper surface 100u of the interlayer dielectric film pattern 100. That is to say, a side upper portion 200su of the first wiring 200 is not surrounded by the interlayer dielectric film pattern 100 but is exposed to the outside.

A pre-barrier metal film (not shown) covering the first opening 200t and the upper surface of interlayer dielectric film pattern 100 may be formed. The pre-barrier metal film may be conformally formed on the side surface of the first opening 200t, the upper surface of the first pattern 30a and the upper surface 100u of the interlayer dielectric film pattern 100. A first metal film (not shown) filling the first opening 200t having the pre-barrier metal film conformally formed thereon is formed. The first metal film is used to form the first wiring 200. The first metal film fills the first opening 200t and covers the upper surface 100u of the interlayer dielectric film pattern 100. The first metal film may be formed by, for example, electroplating, chemical vapor deposition (CVD) or sputtering, but aspects of the present example embodiments are not limited thereto.

A portion of the first metal film and the pre-barrier metal are removed to expose the upper surface of the interlayer dielectric film pattern 100, thereby forming the first wiring 200 and the barrier metal film 210 in the first opening 200t. Here, the upper surface 200u of the first wiring 200 and the upper surface 100u of the interlayer dielectric film pattern 100 may be disposed at the same level.

Referring to FIG. 5, the upper surface 100u of the interlayer dielectric film pattern 100 is etched by, for example, dry or wet etching, thereby exposing a portion of the side surface of the first wiring 200. In other words, a portion of the interlayer dielectric film pattern 100 is etched toward the substrate 1, thereby moving the upper surface 100u of the interlayer dielectric film pattern 100 toward the second buried insulation film 50. When the upper surface 100u of the interlayer dielectric film pattern 100 is moved, the side upper portion 200su of the first wiring 200 and a portion of the barrier metal film are exposed. In some cases, when the upper surface 100u of the interlayer dielectric film pattern 100, an etchant material capable of etching the barrier metal film 210 is added to a portion of the barrier metal film. In this case, only the upper surface 100u of the interlayer dielectric film pattern 100 and the side upper portion 200su of the first wiring 200 are exposed. In view of the second buried insulation film 50, the upper surface 200u of the first wiring 200 is positioned at a higher level than the upper surface 100u of the interlayer dielectric film pattern 100. A height of the protruding first wiring 200 may be in a range of, for example, 5 nm to 25 nm, but aspects of the present example embodiment are not limited thereto. For example, the height of the protruding first wiring 200 may affect a width of a spacer (300 of FIG. 7) to be formed in a subsequent process.

Figure 6:
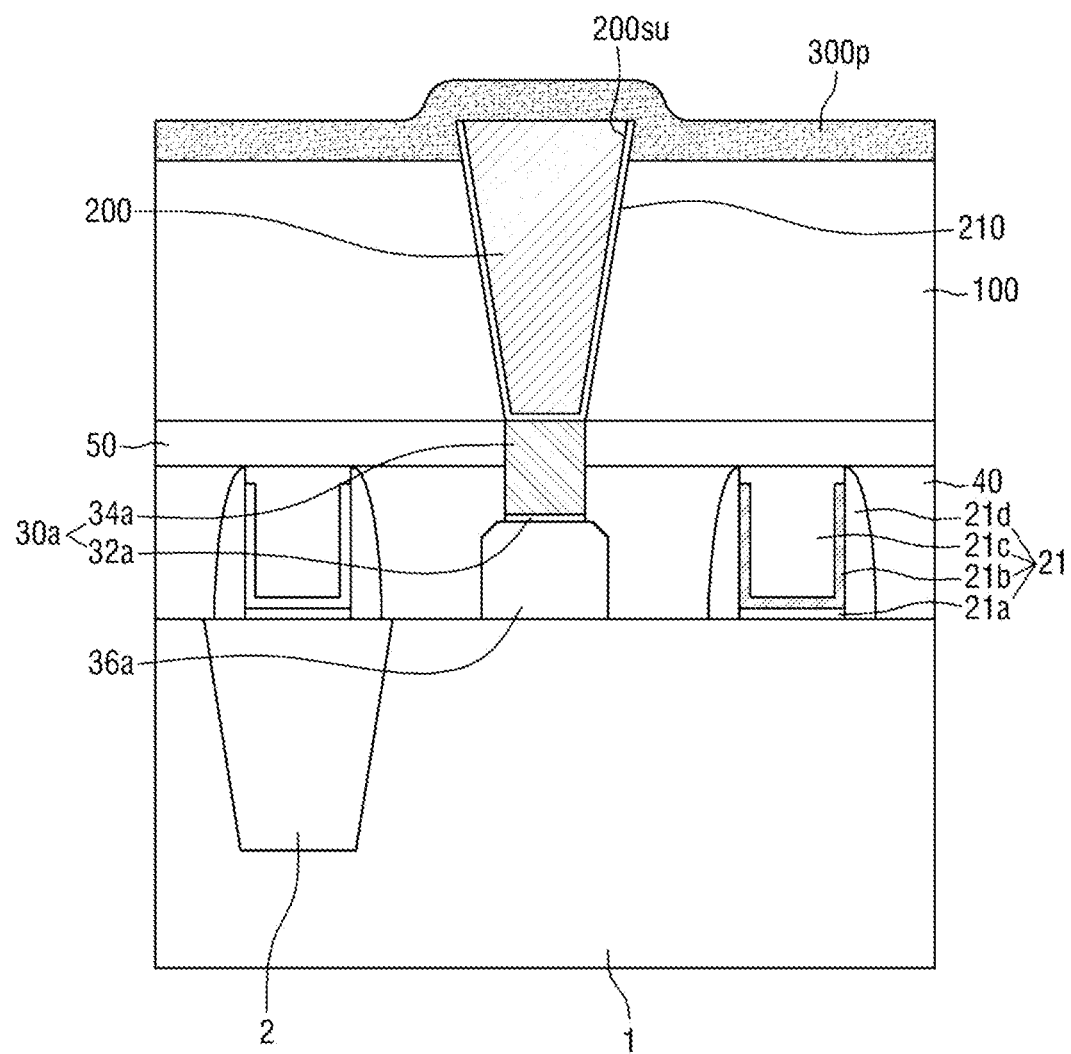

Referring to FIG. 6, a spacer layer 300p covering the interlayer dielectric film pattern 100 and the first wiring 200 is formed. The spacer layer 300p is formed on the upper surface 100u of the interlayer dielectric film pattern 100, on the side upper portion 200su of the exposed first wiring 200 and the upper surface 200u of the first wiring 200. The spacer layer 300p may have a thickness of, for example, 5 nm to 100 nm, but aspects of the present example embodiment are not limited thereto. For example, the spacer layer 300p may affect the width of the spacer (300 of FIG. 7) to be formed in a subsequent process. As the thickness of the spacer layer 300 increases, a step of the spacer layer 300 due to the protruding first wiring 200 may be reduced. If the step of the spacer layer 300 is reduced, the width of the spacer to be formed in a subsequent process can be increased.

Figure 7:
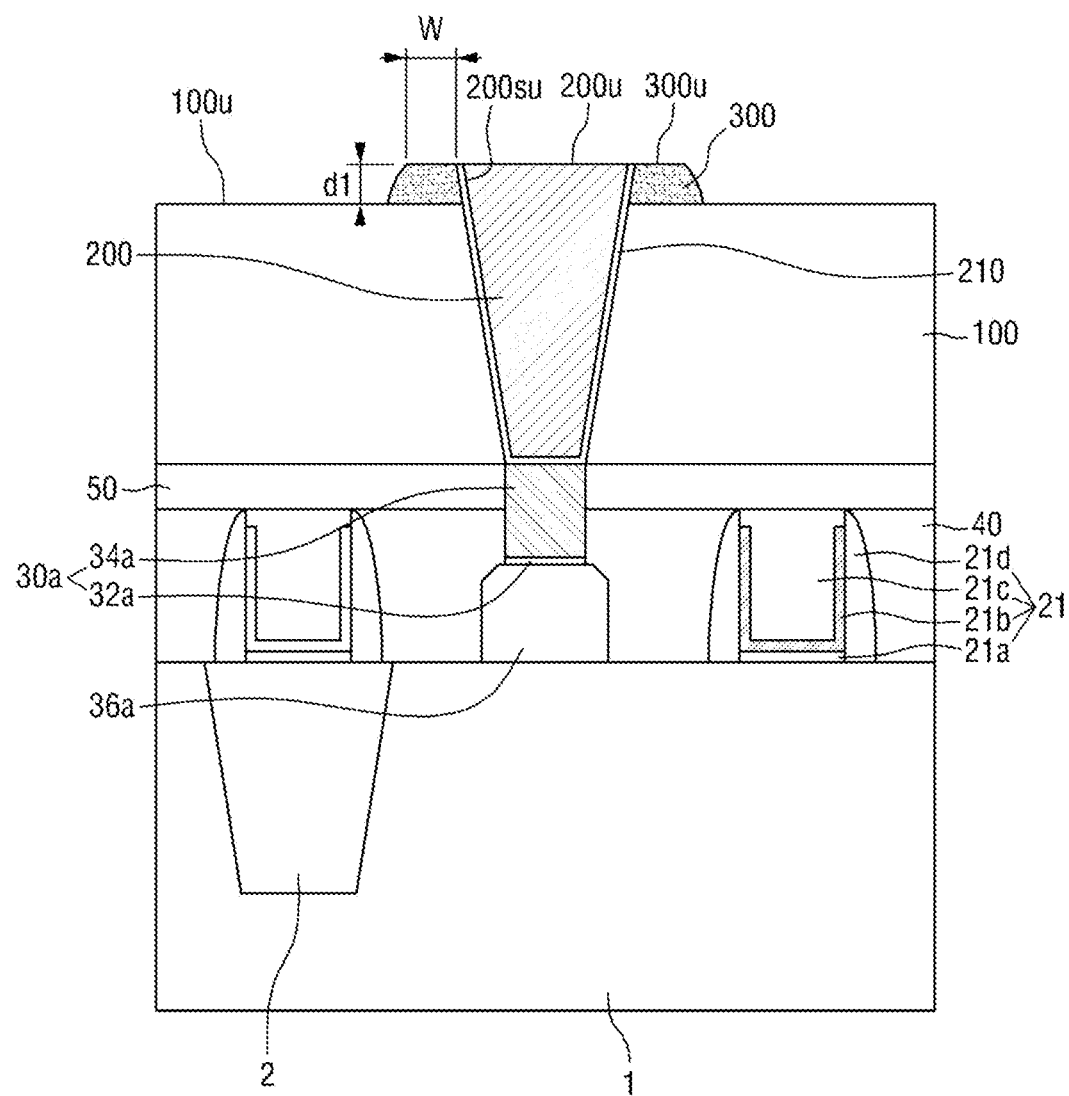

Referring to FIG. 7, the spacer layer 300p is etched to form the spacer 300 at side surfaces of the protruding first wiring 200. The spacer 300 is formed to make contact with the upper surface of the interlayer dielectric film pattern 100 and the side upper portion 200su of the first wiring 200. Referring to FIG. 1, the spacer 300 is formed while surrounding the side upper portion 200su of the first wiring 200 and a top portion of the barrier metal film 210. The spacer 300 is shaped such that its top portion is narrow and its bottom portion is wide. A difference between widths of the top and bottom portions of the spacer may vary according to the etch rate or etchant material of the spacer layer 300p. A width w of the upper surface 300u of the spacer 300 may be in a range of, for example, 9 nm to 15 nm, but aspects of the present example embodiment are not limited thereto. A thickness d1 of the spacer 300 may be equal to a height of the protruding first wiring 200, for example.

Figure 8:
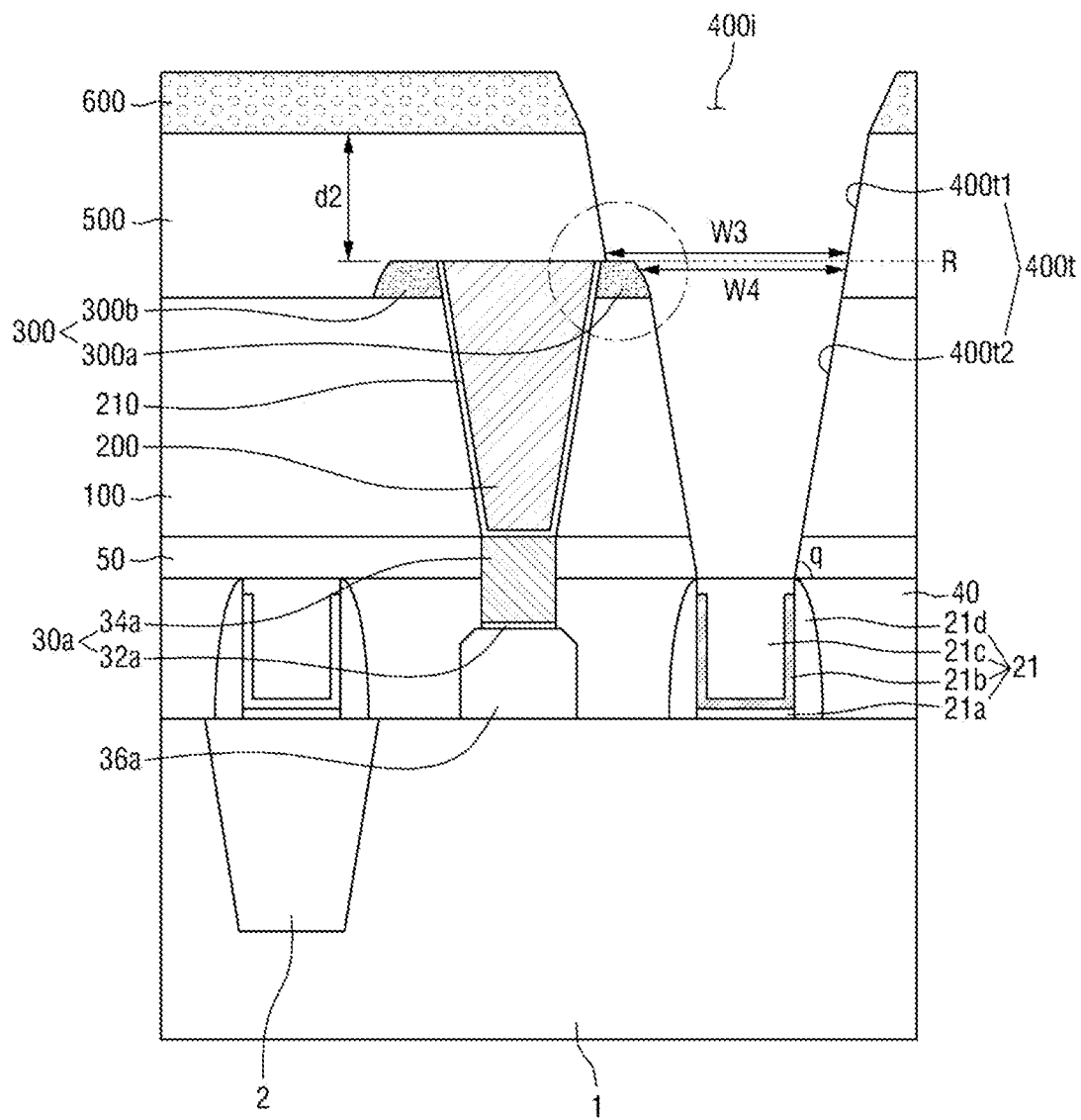

Referring to FIG. 8, a second opening 400t penetrating a mask film 500 and an interlayer dielectric film pattern 100 is formed. If a second buried insulation film is further formed between the gate pattern 21 and the interlayer dielectric film pattern 100, the second opening 400t may also penetrate the second buried insulation film 50. The second opening 400t may be formed on the gate pattern 21 and may expose a top surface of a gate electrode 21c of the gate pattern 21. The second opening 400t may expose a portion of the spacer 300, which will later be described with reference to FIGS. 9A and 9B.

The mask film 500 is formed on the interlayer dielectric film pattern 100, the first wiring 200 and the spacer 300. A thickness d2 of the mask film 500 ranging from a reference R may be, for example, 100 nm or less, but aspects of the example embodiment are not limited thereto. A photoresist film pattern 600 having an opening formed at a location corresponding to the gate pattern 21 is formed on the mask film 500. A critical dimension (CD) of the opening included in the photoresist film pattern 600 may vary according to the slope of a side surface of the second opening 400t to be formed in a subsequent process. The mask film 500 and the interlayer dielectric film pattern 100 are etched using the photoresist film pattern 600 as an etch mask. As a result, the second opening 400t penetrating the mask film 500 and the interlayer dielectric film pattern 100 is formed.

Referring to FIG. 8, a bottom extending line of the second opening 400t and a side surface of the second opening 400t may form a second angle (q). For example, the second angle (q) may be in a range of 82° to 90°. In view of the topmost surface of the spacer 300, the second opening 400t may be divided into two regions. Assuming that reference character R denotes a reference for dividing the second opening 400t into two regions, the second opening formed above R may be a second upper opening 400t1, and the second opening formed below R may be a second lower opening 400t2. The second upper opening 400t1 and the second lower opening 400t2 may have different widths because the spacer 300 may be etched less than the mask film 500 or the interlayer dielectric film pattern 100 or may be barely etched by using an etching resistant material with respect to the mask film 500 and the interlayer dielectric film pattern 100. Assuming that a width of a bottommost portion of the second upper opening 400t1 is denoted by w3 and a width of a topmost portion of the second lower opening 400t2 is denoted by w4, w3 may be equal to or greater than w4. A difference between the width w3 of the bottommost portion of the second upper opening 400t1 and the width w4 of the second lower opening 400t2 may correspond to a width of the top surface of the exposed spacer 300a.

Even if the spacer 300 may be made of an etching resistant material with respect to the mask film 500 and the interlayer dielectric film pattern 100, it may be etched. Accordingly, a first region 300a exposed by the second opening 400t and a second region 300b not exposed by the second opening 400t may have different thicknesses and widths. In other words, a width of a top surface of the first region 300a may be smaller than that of a top surface of the second region 300b. In addition, a thickness of the first region 300a exposed by the second opening 400t may be smaller than that of the second region 300b not exposed by the second opening 400t. In addition, a portion of the first region 300a exposed by the second opening 400t and a portion of the first region 300a not exposed by the second opening 400t may have different thicknesses. Therefore, the top surface of the first region 300a may be, for example, a surface having a step.

Figure 9A:
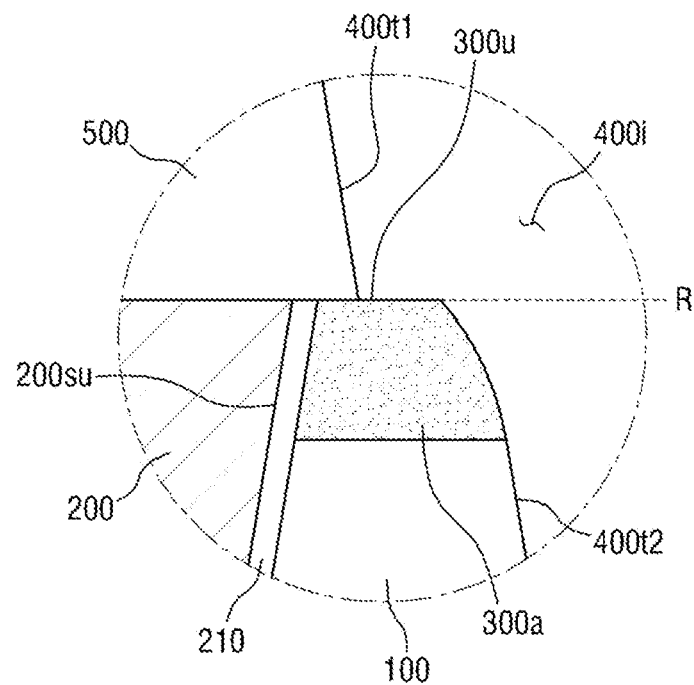

Referring to FIG. 9A, only the first region 300a of the spacer 300 is exposed in an interior portion 400i of the second opening 400t. A width of a bottommost portion of the second upper opening 400t1 is greater than a width of a topmost portion of the second lower opening 400t2. A difference between the width of the bottommost portion of the second upper opening 400t1 and the width of the second lower opening 400t2 may correspond to a width of the upper surface 300u of the first region 300a of the spacer 300.

Figure 9B:
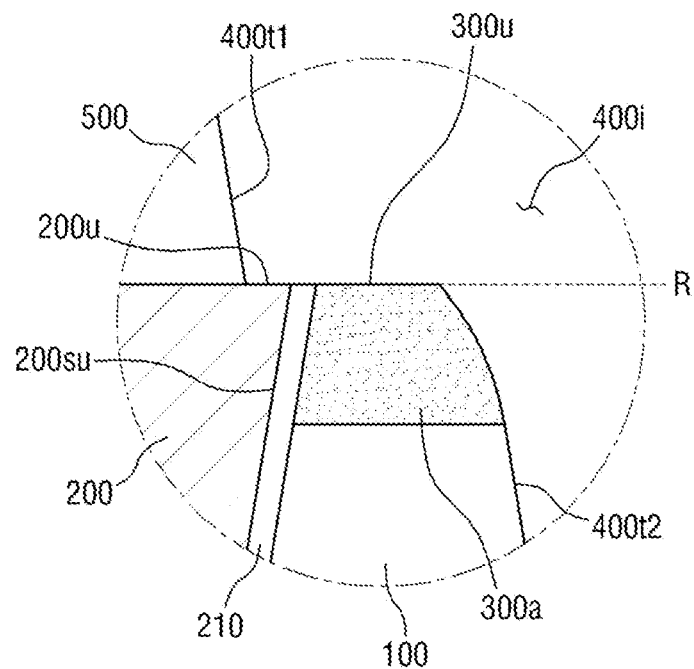

Referring to FIG. 9B, the first region 300a of the spacer 300 and a portion of the upper surface 200u of the first wiring 200 are exposed in the interior portion 400i of the second opening 400t. If a barrier metal film 210 is further formed between the first wiring 200 and the interlayer dielectric film pattern 100, it is also exposed. The width of the bottommost portion of the second upper opening 400t1 is greater than that of the topmost portion of the second lower opening 400t2. A difference between the width of the bottommost portion of the second upper opening 400t1 and the width of the second lower opening 400t2 may correspond to a sum of the width of the upper surface 300u of the first region 300a of the spacer 300, the thickness of the barrier metal film 210 and the width of the upper surface 200u of the exposed first wiring 200. As shown in FIG. 1, as widths between the underlying first and second patterns 30a and 30b and the third pattern 20 are reduced, a width between metal wirings is also reduced. Therefore, not only the first region 300a of the spacer 300 but also the upper surface 200u of the first wiring 200 may be exposed by the second opening 400t.

Figure 10:
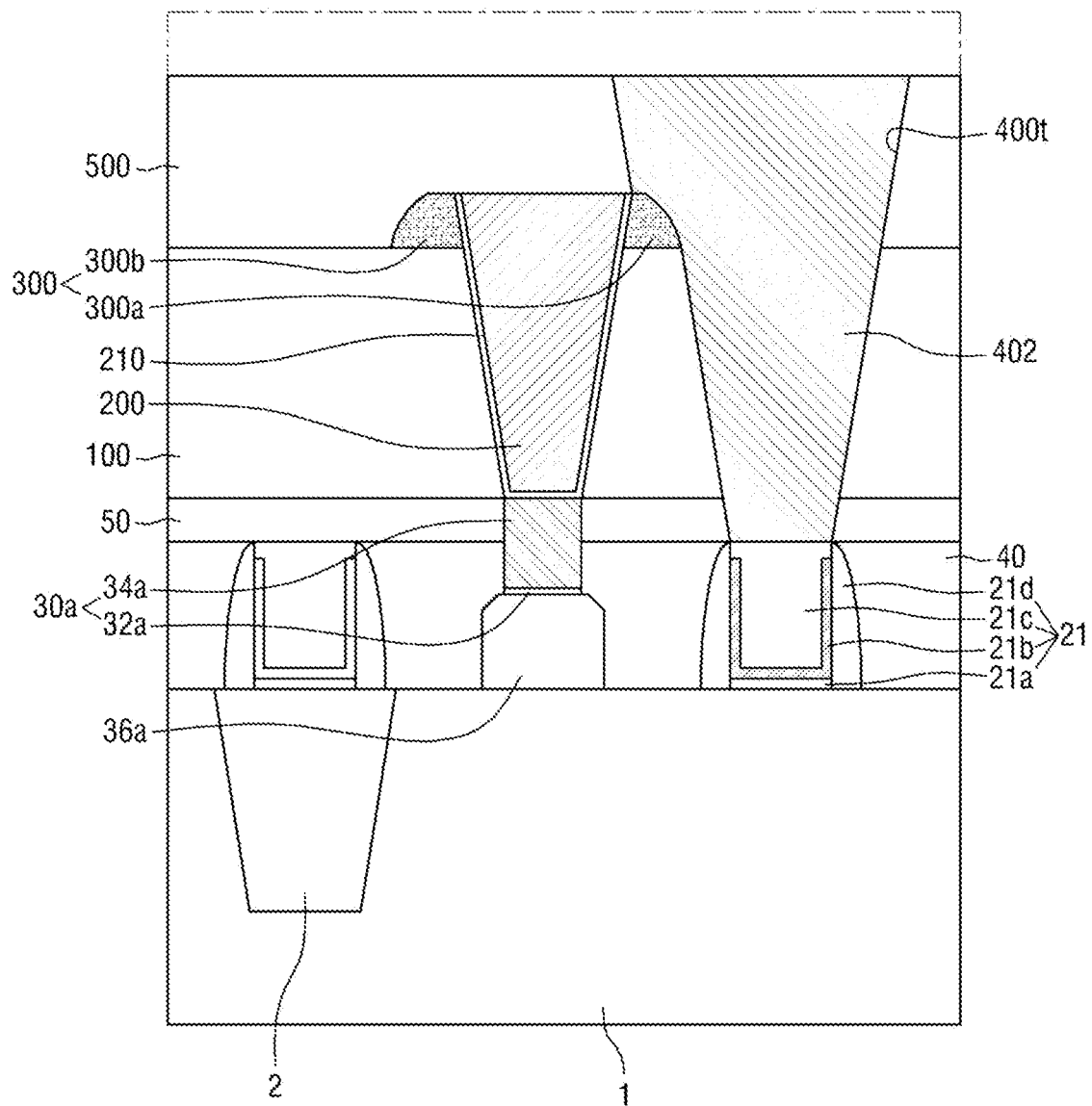

Referring to FIG. 10, the second opening 400t is filled with a second metal film 402. The second metal film 402 may cover not only the second opening 400t but also the upper surface of the mask film 500. The second metal film 402 is used to form the second wiring 400. The second metal film 402 may be formed by, for example, electroplating, chemical vapor deposition (CVD) or sputtering, but aspects of the present example embodiment are not limited thereto. Although not shown in FIG. 10, before the second metal film 402 is formed, a pre-barrier metal film (not shown) may be conformally formed on the second opening 400t and the upper surface of the mask film 500. A portion of the second metal film 402 formed on the upper surface of the mask film 500 is removed, thereby exposing the upper surface of the mask film 500.

In some cases, the second metal film 402 filling the second opening 400t may contact the first wiring 200. As illustrated in FIG. 9B, in a case where the upper surface 200u of the first wiring 200 is exposed by the second opening 400t, the second metal film 402 may contact the first wiring 200.

Figure 11:
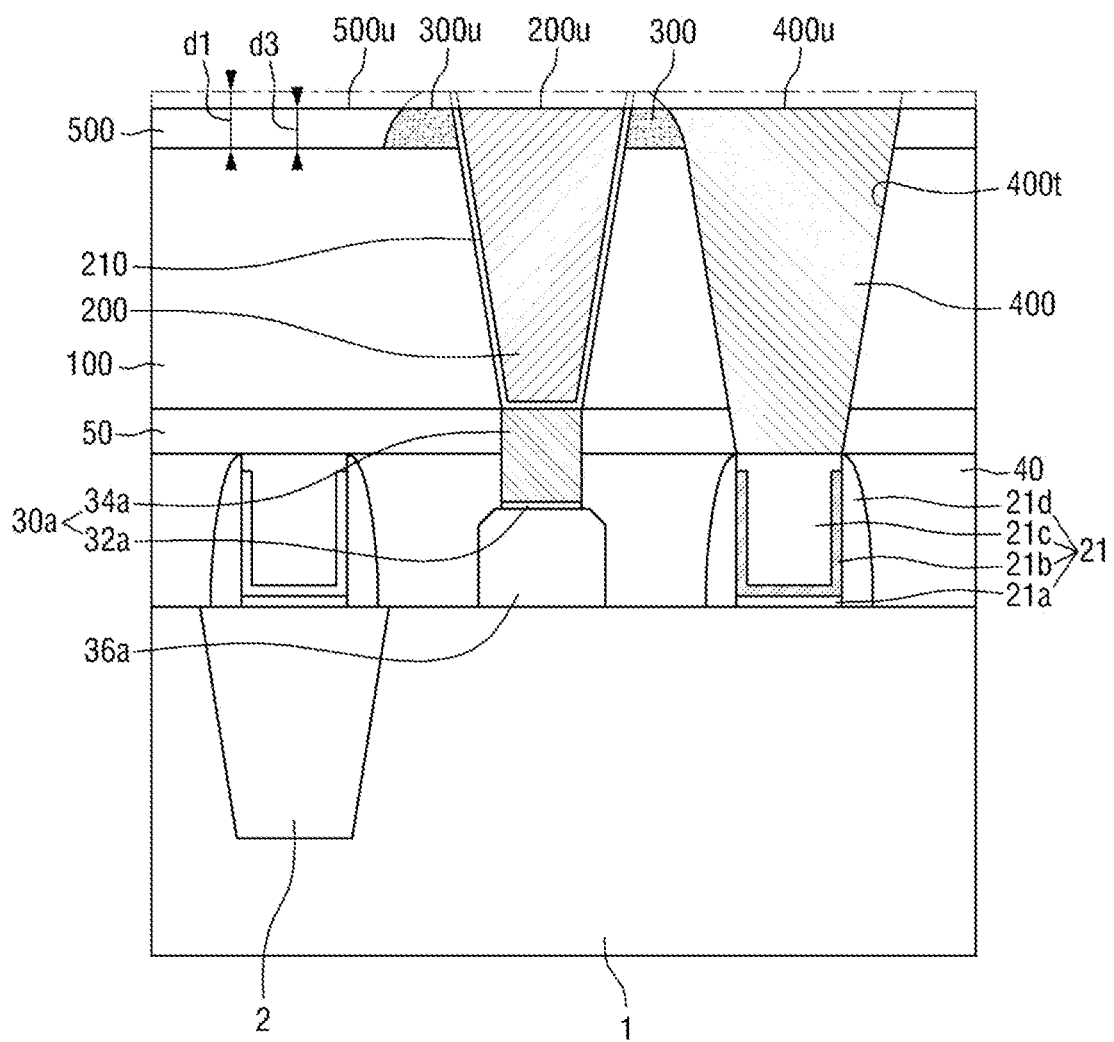

Referring to FIG. 11, the second wiring 400 is formed in the interlayer dielectric film pattern 100 corresponding to the gate pattern 21. The second wiring 400 is separated and spaced apart from the first wiring 200 by the spacer 300. In order to expose the first wiring 200 and the spacer 300, a portion of the mask film 500 and a portion of the second metal film 402 are removed, thereby forming the second wiring 400. As soon as the first wiring 200 and the spacer 300 are exposed, etching of the mask film 500 and the second metal film 402 is stopped, thereby forming the second wiring 400. However, in order to spatially separate the first wiring 200 and the second wiring 400 from each other, after the first wiring 200 and the spacer 300 are exposed, etching of, for example, 2 nm to 3 nm, may further be performed. The upper surface 200u of the first wiring 200, the upper surface 300u of the spacer 300, the upper surface 400u of the second wiring 400 and the upper surface of the mask film 500 may be disposed at the same level.

A thickness d3 of the spacer 300 after forming the second wiring 400 may be substantially the same as the thickness d1 of the spacer 300 before forming the second wiring 400. Here, "the same thickness" may be used to mean that thicknesses at two locations compared are completely equal to each other and to encompass a negligibly small thickness difference due to a processing margin, etc. However, if the spacer 300 is further etched for the purpose of spatially separating the first wiring 200 and the second wiring 400 from each other, d3 may become smaller than d1.

Figure 12:
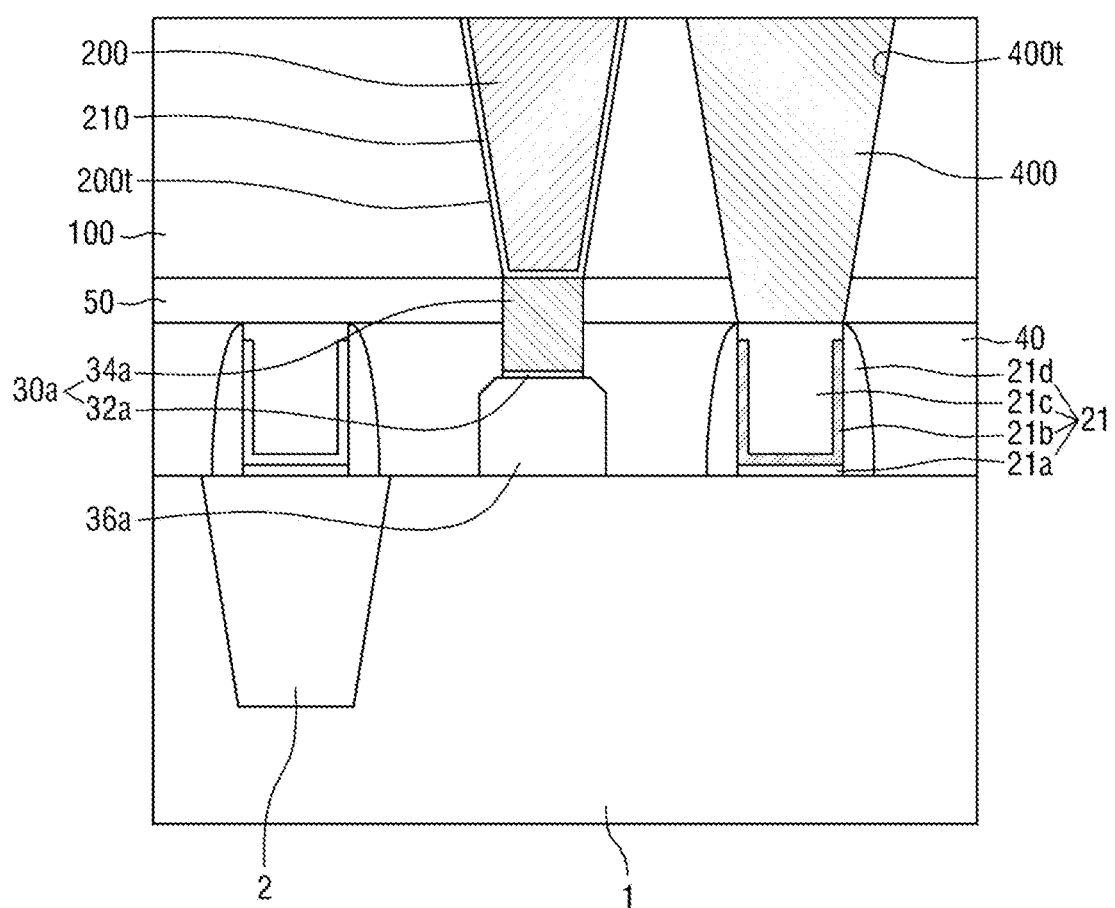

Referring to FIG. 12, when a portion of the second metal film 402 shown in FIG. 11 is removed to form the second wiring 400, the mask film on the interlayer dielectric film pattern 100 may be completely removed. If the mask film 500 is completely removed, the spacer 300 is also removed because a boundary between the mask film 500 and the interlayer dielectric film pattern 100 is the same as a boundary between the spacer and the interlayer dielectric film pattern 100. If the spacer 300 is completely removed, the first wiring 200 and the second wiring 400 may be spaced apart from the bottom surface of the spacer 300. The spacer (300 of FIG. 11) is used for the purpose of stably separating the first wiring 200 and the second wiring 400. Therefore, the method for fabricating the semiconductor device according to the present example embodiment can be achieved even without using the spacer 300.

Hereinafter, a method for fabricating a semiconductor device according to still another example embodiment will be described with reference to FIG. 13. Because the method for fabricating a semiconductor device according to the present example embodiment is substantially the same as the method according to the previous example embodiment shown in FIGS. 4 to 12, except that an upper surface of a first wiring is exposed before forming a second opening, repeated descriptions will be briefly given or omitted.

Figure 13:
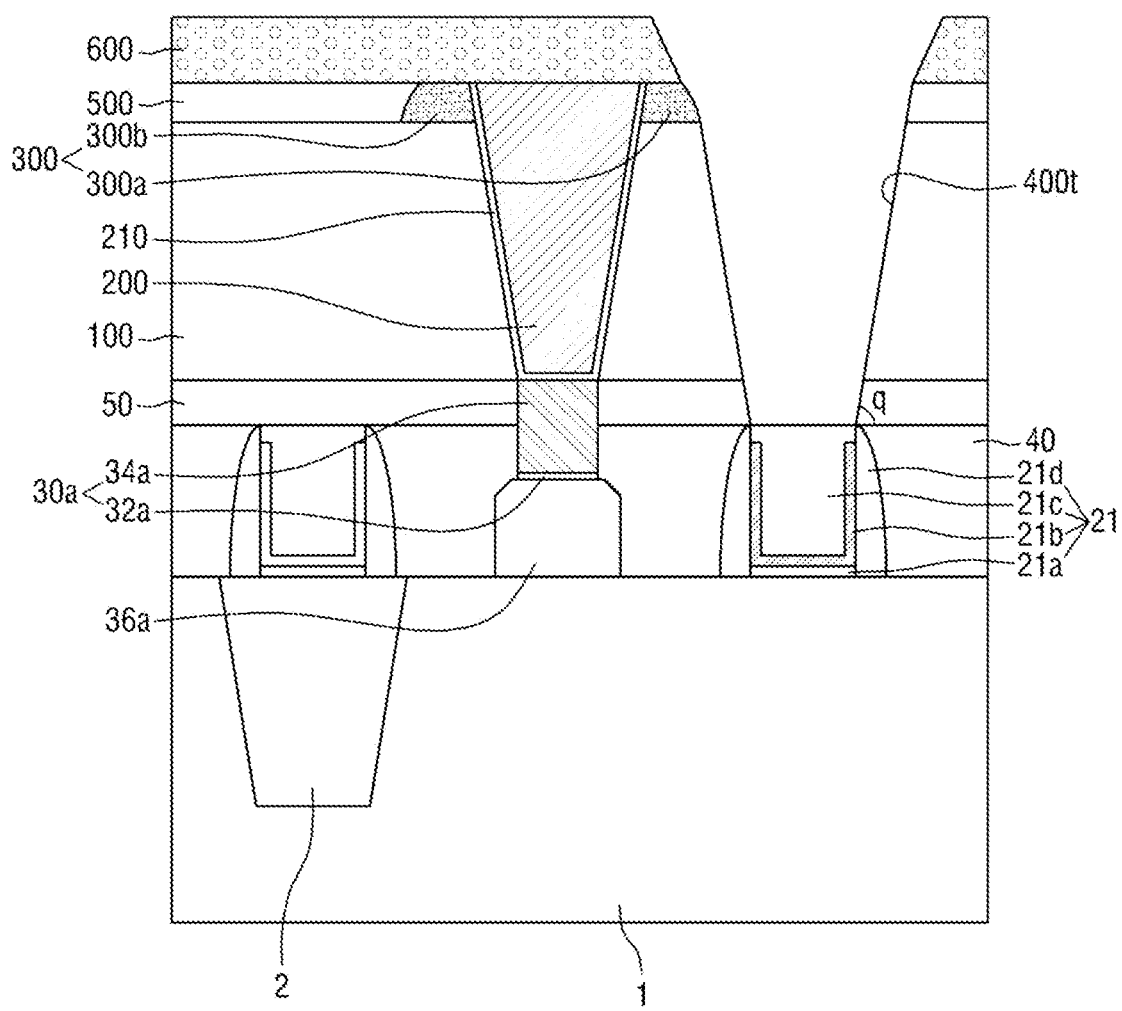
FIG. 13 is a cross-sectional view illustrating a method for fabricating a semiconductor device according to still another example embodiment.

FIG. 13 is a cross-sectional view illustrating a method for fabricating a semiconductor device according to still another example embodiment.

Referring to FIG. 13, a second opening 400t penetrating a mask film 500 and an interlayer dielectric film pattern 100 is formed. The mask film 500 is formed on the interlayer dielectric film pattern 100, the first wiring 200 and the spacer 300. On the plan view, the interlayer dielectric film pattern 100, the first wiring 200 and the spacer 300 are completely covered by the mask film 500. Thereafter, a portion of the mask film 500 is etched, thereby exposing the spacer 300 and the first wiring 200. A photoresist film pattern 600 having an opening formed at a location corresponding to a gate pattern 21 is formed on the spacer 300, the first wiring 200 and the mask film 500. A portion of the spacer 300 may be exposed by the opening in the photoresist film pattern 600. The mask film 500 and the interlayer dielectric film pattern 100 are etched using the photoresist film pattern 600 as an etch mask. As a result, the second opening 400t penetrating the mask film 500 and the interlayer dielectric film pattern 100 is formed.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages. Accordingly, all such modifications are intended to be included within the scope of this invention as defined in the claims. Therefore, it is to be understood that the foregoing is illustrative of various example embodiments and is not to be construed as limited to the specific embodiments disclosed, and that modifications to the disclosed embodiments, as well as other embodiments, are intended to be included within the scope of the appended claims.

What is claimed is:

1. A semiconductor device, comprising:
an interlayer dielectric film pattern over a substrate;
a first wiring within the interlayer dielectric film pattern and having a first length in a first direction, the first wiring including a first sidewall and a second sidewall opposing each other;
a second wiring within the interlayer dielectric film pattern and separated from the first wiring,
the second wiring having a second length different from the first length in the first direction,
the second wiring including a third sidewall and a fourth sidewall opposing each other, and
an upper surface of the first wiring being coplanar with an upper surface of the second wiring; and
a spacer contacting the first wiring and the second wiring,
the spacer electrically separating the first wiring and the second wiring from each other and being made of an etching resistant material different from the interlayer dielectric film pattern,
the spacer being disposed between the first sidewall and the third sidewall, and on the second sidewall,
the spacer not being disposed on the fourth sidewall, and
the upper surface of the first wiring, the upper surface of the second wiring and an upper surface of the spacer are formed at a same level.

2. The semiconductor device of claim 1, wherein,
the spacer includes a first region and a second region, and
the first region is between the first wiring and the second wiring and has a width smaller than a width of the second region.

3. The semiconductor device of claim 1, wherein,
the first wiring includes a first side surface extending in the first direction and a second side surface extending in a second direction, and
the second wiring is adjacent to the first side surface.

4. The semiconductor device of claim 3, wherein,
the first wiring is rectangular, and
the first side surface is longer than the second side surface.

5. The semiconductor device of claim 1, further comprising:
a first active region and a second active region spaced apart from each other on the substrate;
a first pattern and a second pattern on the first active region and the second active region, respectively;
a third pattern traversing the first active region and the second active region,
the first pattern and the second pattern being on a same side surface of the third pattern,
the first pattern and the second pattern being connected to the first wiring, and
the third pattern being connected to the second wiring.

6. The semiconductor device of claim 5, wherein,
the first pattern and the second pattern each include a metal plug stacked over a silicide film, and
the third pattern is a gate pattern.

7. The semiconductor device of claim 5, wherein,
the third pattern extends in the first direction,
the first wiring extends within the first active region and the second active region to be parallel with the third pattern, and
the second wiring does not overlap with the first active region and the second active region.

8. The semiconductor device of claim 1, further comprising:
a barrier metal film between the spacer and the first wiring.
9. The semiconductor device of claim 1, wherein the spacer includes at least one of SiN, SiON, SiCN, SiOC and combinations thereof.
10. A semiconductor device, comprising:
first patterns arranged on a substrate along a same longitudinal axis in a first direction,
a second pattern on the substrate adjacent to the first patterns;
an interlayer dielectric film pattern including a first opening and a second opening over the first patterns and the second pattern, respectively;
a first wiring and a second wiring filling the first opening and the second opening, respectively,
the first wiring extending over the substrate in the first direction, and
opposing ends of the first wiring extending over a respective one of the first patterns in the first direction; and
a spacer between a side upper portion of the first wiring and a side upper portion of the second wiring, the spacer separating the first wiring and the second wiring from each other,
wherein the first patterns are electrically connected by the first wiring, and the first wiring is on the first patterns, and
an upper surface of the first wiring, an upper surface of the second wiring and an upper surface of the spacer are formed at a same level.
11. The semiconductor device of claim 10, wherein,
an upper portion of the spacer on one side surface of the first wiring and the second wiring has a first width,
an upper portion of the spacer on another side surface of the first wiring than the one side surface has a second width, and
the first width is smaller than the second width.
12. The semiconductor device of claim 10, further comprising:
a buried insulation film including a first trench and a second trench between the substrate and the interlayer dielectric film pattern,
the first trench and the second trench corresponding to the first wiring and the second wiring, respectively,
the second pattern including a gate insulation film and a gate electrode in the second trench,
the gate electrode including portions conformally covering side surfaces and a bottom surface of the second trench, and
the first patterns including a metal plug on a silicide film in the first trench.
13. The semiconductor device of claim 12, wherein an uppermost surface of the substrate positioned at a lower portion of the first trench is elevated relative to the uppermost surface of the substrate positioned at a lower portion of the second trench.
14. A semiconductor device, comprising:
a first contact pattern and a second contact pattern each traversing different active regions of a substrate;
a third contact pattern on the substrate, the first and second contact patterns extending along a same side of the third contact pattern;
an interlayer dielectric film pattern over the first, second and third contact patterns; and
a multi-wiring structure extending through the interlayer dielectric film pattern, the multi-wiring structure including a first wiring and a second wiring separated from each other and a spacer adjoined to the first and second wirings,
the first wiring being parallel with the third contact pattern,
the first wiring being on and electrically connected to the first and second contact patterns, and
the second wiring being electrically connected to the third contact pattern, and
an upper surface of the first wiring, an upper surface of the second wiring, and an upper surface of the spacer being formed at a same level.
15. The semiconductor device of claim 14, wherein the spacer covers upper sidewalls of the first wiring, and
a portion of the spacer adjoined to the first and second wirings has a width that decreases toward the upper surface of the first wiring.
16. The semiconductor device of claim 14, wherein the second wiring is spaced apart from each of the different active regions.
17. The semiconductor device of claim 14, wherein first wiring has the upper surface extending along a single plane.
18. The semiconductor device of claim 14, further comprising:
a barrier metal film conformally covering sidewalls and a bottom surface of the first wiring,
wherein the spacer and the barrier metal film spatially separate the first wiring from the second wiring.
19. The semiconductor device of claim 18, wherein the spacer is directly adjoined to the second wiring and indirectly adjoined to the first wiring via the barrier metal film.
20. A semiconductor device, comprising:
an interlayer dielectric film pattern over a substrate;
a first wiring within the interlayer dielectric film pattern and having a first length in a first direction, the first wiring including a first sidewall and a second sidewall opposing each other;
a second wiring within the interlayer dielectric film pattern and separated from the first wiring,
the second wiring having a second length different from the first length in the first direction; and
the second wiring including a third sidewall and a fourth sidewall opposing each other; and
a spacer contacting the first wiring and the second wiring,
the spacer electrically separating the first wiring and the second wiring from each other and being made of an etching resistant material different from the interlayer dielectric film pattern,
the spacer being disposed between the first sidewall and the third sidewall, and on the second sidewall,
the spacer including a first portion on an uppermost portion of the first sidewall, and a second portion between the second sidewall and the third sidewall,
the first portion not contacting the first sidewall below the uppermost portion of the first sidewall, and
the spacer not being disposed on the fourth sidewall.

* * * * *